United States Patent
Tachi

[19]

[11] Patent Number: 6,097,255
[45] Date of Patent: Aug. 1, 2000

[54] PHASE LOCKED LOOP CIRCUIT FOR ELIMINATING IMPULSES IN OUTPUT DATA WHICH TEND TO PRODUCE MALFUNCTIONS

[75] Inventor: Katsuichi Tachi, Kanagawa, Japan

[73] Assignee: Sony Cinema Products Corporation, Culver City, Calif.

[21] Appl. No.: 09/018,084

[22] Filed: Feb. 3, 1998

Related U.S. Application Data

[63] Continuation of application No. PCT/JP97/01937, Jun. 6, 1997.

[30] Foreign Application Priority Data

Jun. 6, 1996 [JP] Japan .................................. 8-144170

[51] Int. Cl.[7] .............................. H03L 7/08; H03L 7/085
[52] U.S. Cl. ........................... 331/25; 331/1 A; 375/376; 327/159; 360/51
[58] Field of Search ..................... 331/25, 1 A; 327/159, 327/156; 375/376; 360/51

[56] References Cited

U.S. PATENT DOCUMENTS

| | | | |
|---|---|---|---|
| 4,600,994 | 7/1986 | Hayashi | 364/484 |
| 4,773,085 | 9/1988 | Cordell | 331/1 A |
| 5,166,644 | 11/1992 | Saito et al. | 331/17 |

FOREIGN PATENT DOCUMENTS

| | | |
|---|---|---|
| 0 637 137 | 2/1995 | European Pat. Off. . |
| 4-186913 | 7/1992 | Japan . |
| 8-97691 | 4/1996 | Japan . |
| WO 96 01007 | 1/1996 | WIPO . |

*Primary Examiner*—Arnold Kinkead
*Attorney, Agent, or Firm*—Frommer Lawrence & Haug, LLP.; William S. Frommer

[57] ABSTRACT

A phase-locked loop circuit adapted to follow up with the phase of an input signal includes a phase comparator 150 for phase-comparing, in synchronism with pre-set operating clocks, an input reference signal to an input signal entered as a counterpart for comparison. Since a first detector 154, a second detector 155 and JK-flip-flops 162, 163 output data responsive to pre-set operating clocks, there is produced no phase lag between NU data and ND data nor the phase lag between two tri-state logical outputs. In a conventional system, the phase lag between NU data and ND data was generated due to the differential delay of the input data caused by looped or the feedback components. Since the two input signals, namely the reference signal and the input signal, are phase-compared to each other in synchronism with the pre-set operating clocks, the comparison data obtained as a result of the phase comparison are outputted at a pre-set period thus reducing the malfunctions otherwise produced in the entire circuit.

2 Claims, 7 Drawing Sheets

PHASE LOCKED LOOP CIRCUIT FOR ELIMINATING IMPULSES IN OUTPUT DATA WHICH TEND TO PRODUCE MALFUNCTIONS

This is a continuation of copending International Application PCT/JP97/01937 having an international filing date of Jun. 6, 1997.

TECHNICAL FIELD

This invention relates to a phase locked loop circuit which follows up with the phase of an input signal.

BACKGROUND ART

So far, a phase-locked loop circuit (PLL) is used for extracting synchronization signals or clocks in a VTR or a disc reproducing apparatus.

This phase-locked loop is a circuit for producing an output synchronized in phase or frequency with a reference signal. It is a frequency feedback circuit having a phase comparator 251 for comparing the phase relation between two signals and outputting the result of comparison, a low-pass filter for taking out low frequency components of the output of the phase comparator 251 and a voltage-controlled oscillator (VCO) 256 for varying the oscillation frequency responsive to the output of the low-pass filter.

Figure 1:
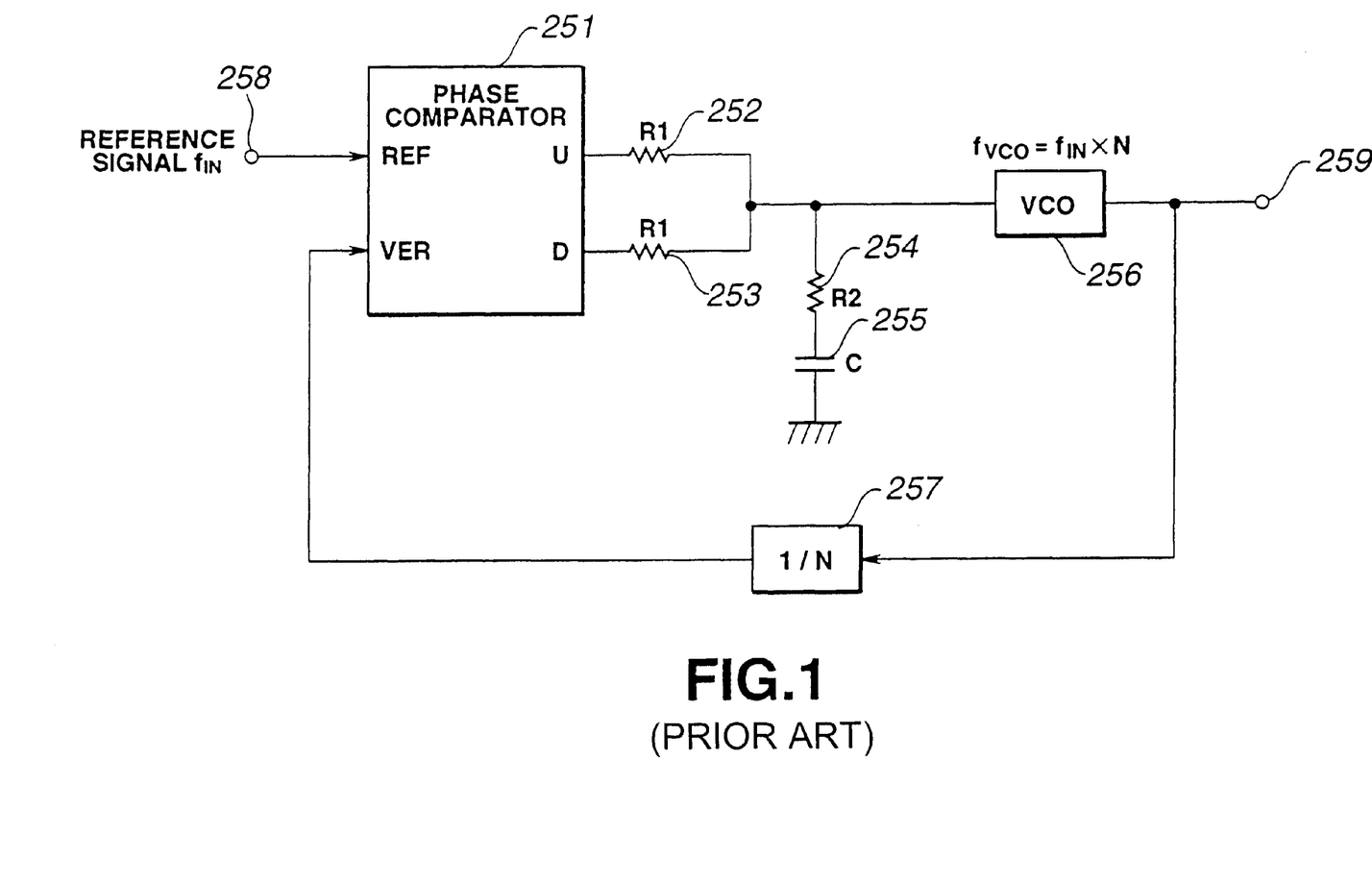
FIG. 1 is a schematic block diagram showing a conventional phase-locked loop circuit.

Referring to FIG. 1, a reference signal having a frequency equal to $f_{in}$ enters an input terminal 258 and thence is supplied to above-described REF input terminal of the phase comparator 251. Also, a VCO output signal from the VCO 256, having a frequency equal to $f_{VCO}$, is fed via a frequency dividing circuit 257 to a VER input terminal of the phase comparator 251.

The phase comparator 251 phase-compares the reference signal and an output signal of the frequency dividing circuit 257 to output the results of comparison via a terminal U or a terminal V if the reference signal is advanced in phase or the output signal of the frequency dividing circuit 257 is advanced in phase, respectively.

There are also provided a resistor 252, having its one terminal and its other terminal connected to the terminal U and to the VCO 256, respectively, and a resistor 253 having its one terminal and its other terminal connected to the terminal V and the VCO 256, respectively. There is also provided a resistor 254 having its one terminal connected to output sides of the resistors 252, 253 and to one end of a capacitor 255, the opposite end of which is grounded.

The resistors 252/253, resistor 254 and the capacitor 255 make up the low-pass filter.

This low-pass filter cuts off the high frequency components of the above results of comparison to route the dc components to the VCO 256.

The VCO 256 is responsive to the inputting of the dc component to oscillate and output a signal at the frequency $f_{VCO}$, which is set so that $f_{VCO}=f_{in}\times N$. The oscillation output is routed to an output terminal 259 and to the VCO circuit 257.

The frequency dividing circuit 257 converts the oscillation output with the frequency of $f_{VCO}$ into a signal with a frequency equal to 1/N, that is into the signal having the frequency of $f_{in}$. This signal is fed to the terminal VER of the phase comparator 251.

In the above structure of the phase-locked loop, the VCO output signal is synchronized at all times with the reference signal at a pre-set constant frequency.

There is also known a dedicated IC produced on gate-arraying or integrating with the phase comparator 251 and the VCO 256. This IC is available as a small size device.

Figure 2:
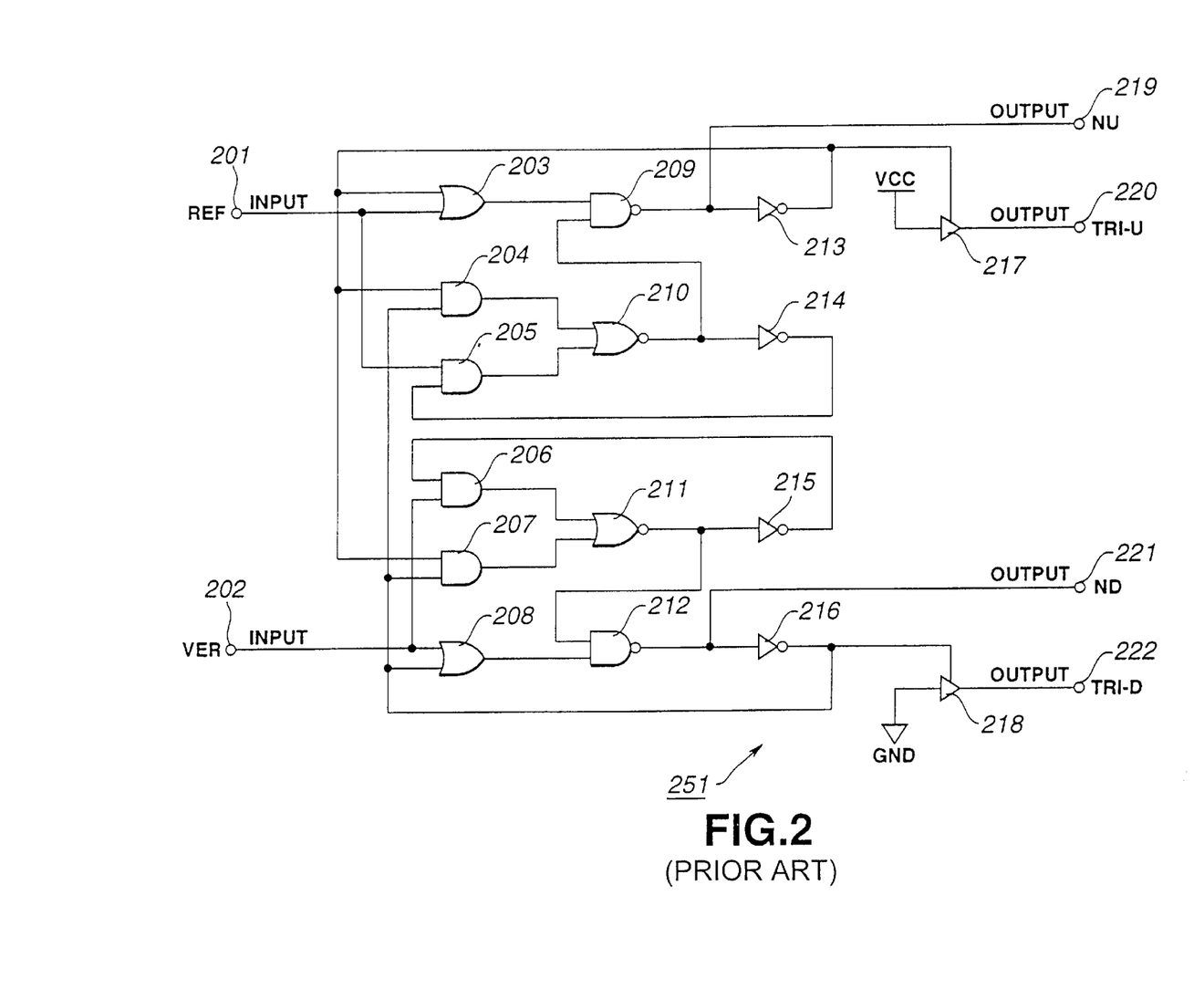
FIG. 2 is a block circuit diagram showing an illustrative example of a phase comparator used in the conventional phase-locked loop circuit shown in FIG. 1.
Figure 3:
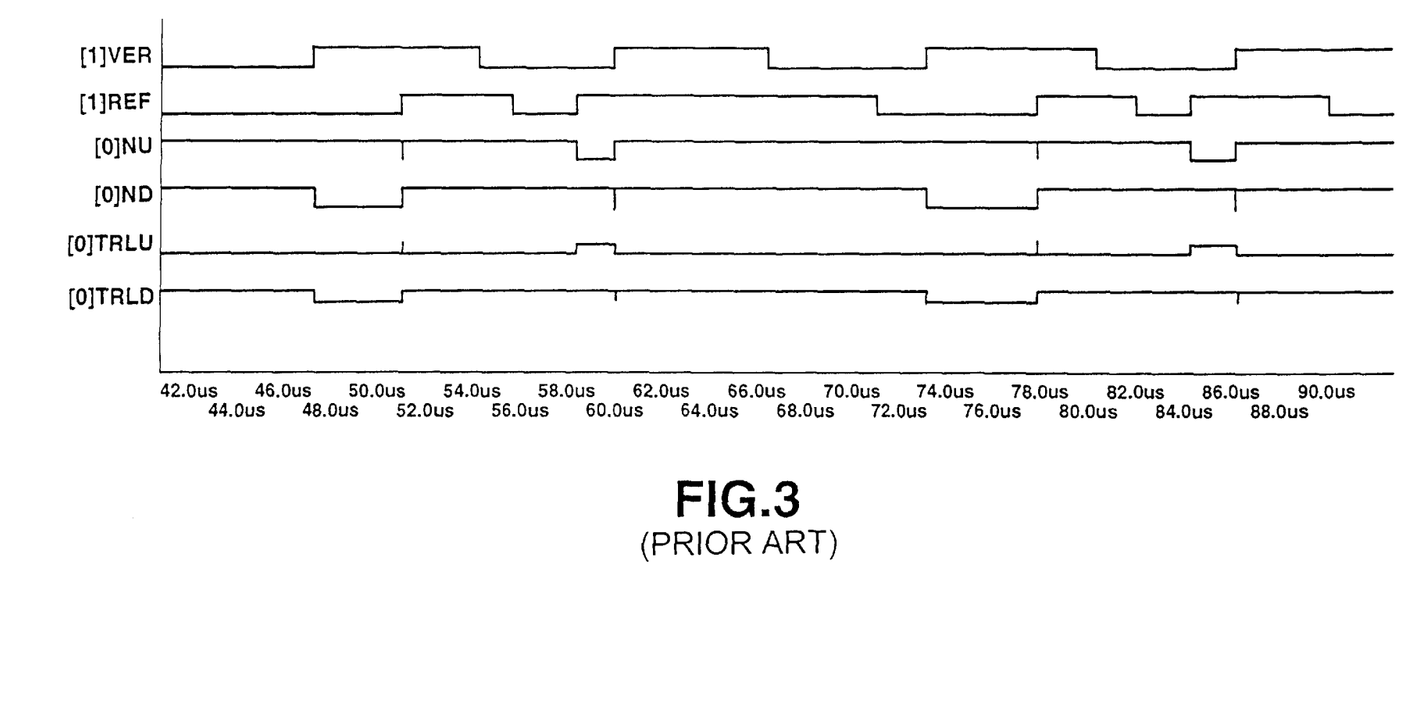
FIG. 3 shows a timing chart of input and output data to or from the phase comparator.

The phase comparator 251 is constructed by a combination of logic circuits as shown in FIG. 2. FIG. 3 shows a timing chart of reference data (REF), input data (VER) and other data.

Referring to FIG. 3, ND data are outputted as from the rising of input data up to rising of the next reference data, whilst NU data are outputted as from the rising of the next input data up to rising of the next reference data. The ND data and the NU data are generated and outputted by the phase comparator 251.

Thus, if the phase comparator for outputting the ND data or the NU data are constructed as shown in FIG. 2, there are occasions wherein various loops or feedback loops exist from the input to the output, these loops exhibiting non-symmetrical delays in the IC.

For example, the one input terminal of the OR gate 203 of the first stage is directly fed with the reference signal from a REF input terminal 201, while its opposite side input terminal is fed with, for example, an output from an inverter 213. Between these two signals, there is produced a difference in delay of at least three stages.

Thus, in many cases, the delays of two signals entering the logic circuits differ from each other. This differential delay is responsible for generation of so-called whiskers in the NU data or ND data in the timing chart of FIG. 3, thus tending to produce malfunctions of the PLL circuit in its entirety.

Although interconnections may be designed in consideration of the above delays, difficulties are encountered especially in interconnection management in a gate array circuit.

In view of the above-described status of the art, it is an object of the present invention to provide a phase-locked loop circuit which is simpler in structure and which is insusceptible to malfunctions of the entire circuit.

DISCLOSURE OF THE INVENTION

The above object may be accomplished by the present invention by a phase-locked loop circuit adapted to follow up with the phase of an input signal, including a phase comparator for phase-comparing an input reference signal to an input signal entered as a counterpart for comparison in synchronism with pre-set operating clocks.

Since the two input signals, namely the reference signal and the input signal, are phase-compared to each other in synchronism with the pre-set operating clocks, the comparison data obtained as a result of the phase comparison is outputted at a pre-set period.

BEST MODE FOR CARRYING OUT THE INVENTION

Referring to the drawings, preferred embodiments of the present invention will be explained in detail.

Figure 4:
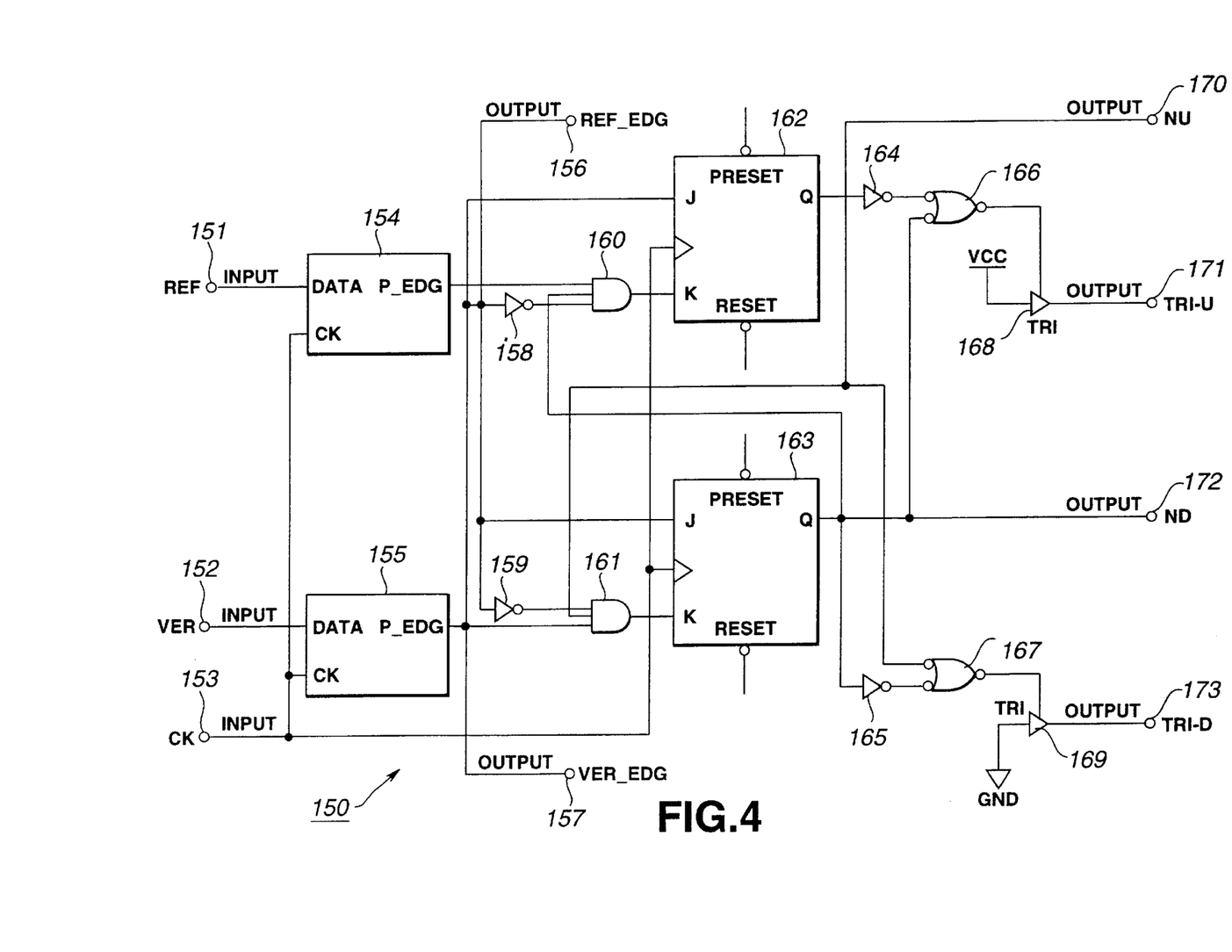
FIG. 4 is a block circuit diagram showing an illustrative structure of a phase comparator used in the phase-locked loop circuit according to the present invention.

The phase-locked loop circuit according to the present invention is designed to follow up with the phase of an input signal and includes a phase comparator 150 shown in FIG. 4 for performing phase comparison between an input reference signal and an input signal as an object for comparison in synchronism with pre-set operating clocks.

The phase comparator 150 includes a first detector 154 for detecting the rising portion of reference data (REF), obtained on the basis of the above reference signal, in synchronism with the above operating clocks, and a second detector 155 for detecting the rising portion of input data (VER), obtained on the basis of the above input signal, in synchronism with the above operating clocks.

Figure 5:
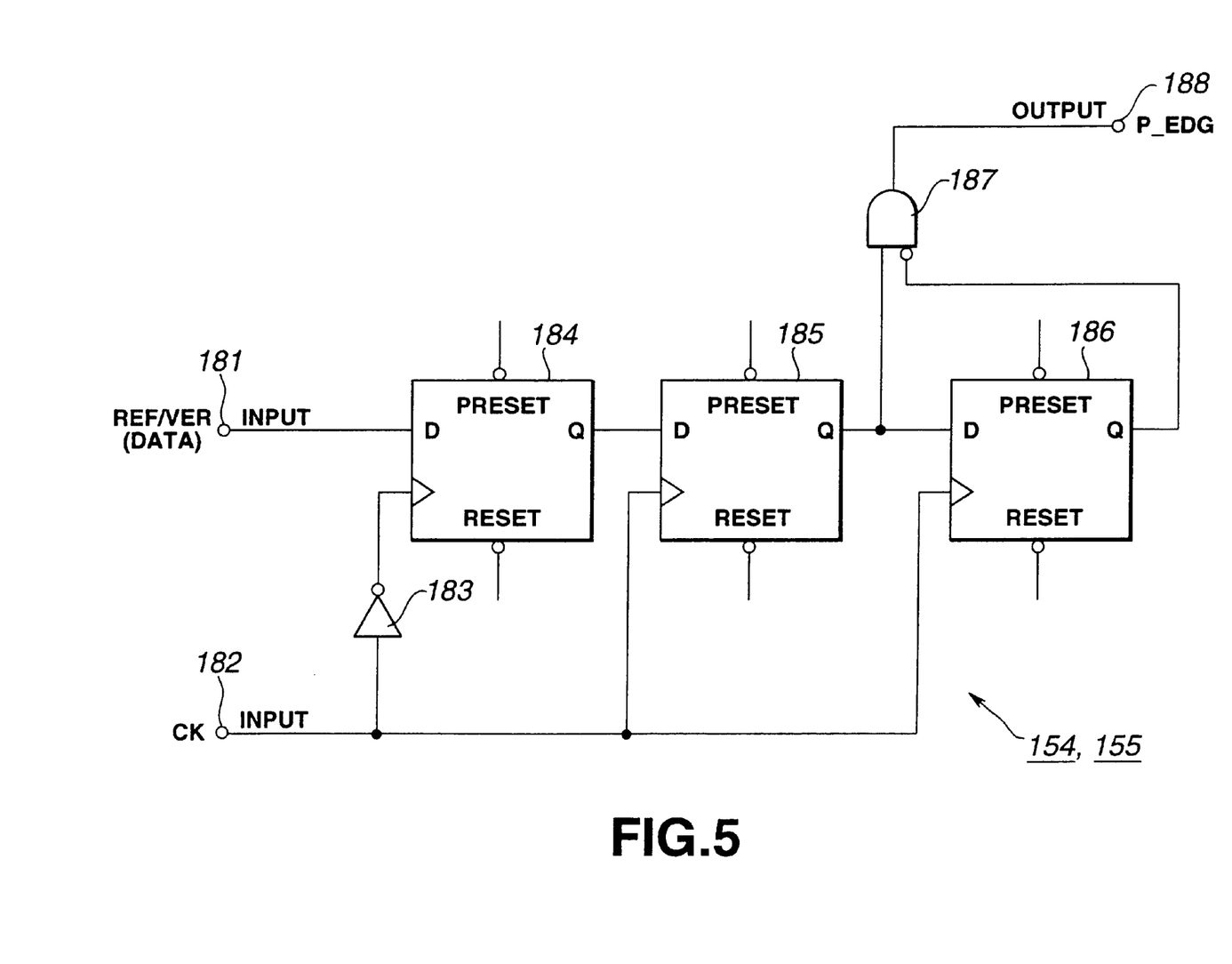
FIG. 5 is a block circuit diagram showing an illustrative structure of an edge detecting portion used in the phase comparator shown in FIG. 4.

Referring to FIG. 5, the first/second detectors 154, 155 include a D-flip-flop 184, as a first logic circuit for storing and outputting the reference data or the input data (DATA) responsive to the operating clocks (CK), and a D-flip-flop 185, as a second logic circuit for storing and outputting output data of the D-flip-flop 184 responsive to an input of the operating clocks. The first/second detectors 154, 155 also include a D-flip-flop 186 as a third logic circuit for storing and outputting output data of the D-flip-flop 185 responsive to input of the operating clocks and a fourth logic circuit 187 for performing an AND operation on output data of the D-flip-flop 185 and a complemented output of output data of the D-flip-flop 186.

The reference data entered from the REF terminal 151 in FIG. 4 is sent to the first detector 154. This reference data is of the frequency of, for example, 96 Hz, as shown in an illustrative embodiment as later explained, and is entered at the REF terminal 151.

The first detector 154 is fed with operating clocks from a CK input terminal 153. The rising edge of the reference data is detected responsive to the input of the operating clocks. The first edge data (P-EDG) as this detected data is sent to a first edge output terminal (REF-EDG) 156, a first AND gate 160, a J-terminal of the first JK-flip-flop 163 and to a first inverter 159.

The frequency of these operating clocks is outside the band of the low-pass filter provided on an output end of each data, not shown. This frequency is set to, for example, 1.764 MHz, as in an illustrative embodiment explained subsequently. This eliminates the risk of occurrence of the quantization error.

The input data from a VER input terminal 152 is sent to a second detector 155. This input data, similarly to the input reference data, is of the frequency of 96 Hz.

The second detector 155 is fed with the operating clocks from a CK input terminal 153. The rising of the reference data is detected responsive to the input of the operating clocks. The second edge data (P-EDG) as this detected data is sent to a second edge output terminal (VER-EDG) 157, a second AND gate 161, a J-terminal of the second JK-flip-flop 162 and to a second inverter 158.

The first inverter 159 complements the input first edge data to send the complemented edge data to a second AND gate 161. The second inverter 158 complements the input second edge data to send the complemented edge data to a first AND gate 160.

The first AND gate 160 is responsive to the first edge data, complemented data of the second edge data and to the first edge state data from the first JK-flip-flop 163 as later explained to output data "1" to the K terminal of the second JK-flip-flop 162 only when all data are "1", and to output data "0" to the K terminal when otherwise.

The second AND gate 161 is responsive to the second edge data, complemented data of the first edge data and to the second edge state data from the second JK-flip-flop 162 as later explained to output data "1" to the K terminal of the first JK-flip-flop 163 only when all data are "1", and to output data "0" to the K terminal when otherwise.

The first JK-flip-flop 163 is responsive to the inputting of the operating clocks from the CK input terminal 153 to compare the phase of the input data to that of the reference data to give the phase deviation, especially the amount of phase lag of the input data from the reference data, as the result of comparison. The ND data, as the result of comparison, is sent via second AND gate 160 and a third inverter 165 to a third logic circuit 167, adapted for performing the input 'negative logic' AND operation, a fourth logic circuit 166 and to a ND output terminal 172.

The second JK-flip-flop 162 is responsive to the inputting of the operating clocks sent from the CK input terminal 153 to compare the phase of the input data to that of the reference data to give the phase deviation, in particular the phase lead of the input data with respect to the reference data, as the result of comparison. The NU data, as this result of comparison, is sent via first AND circuit 161 and fourth inverter 164 to a fourth logic circuit 166, a third logic circuit 167 and to an output terminal 170.

That is, the ND data is equivalent to the phase lag of the input data from the reference data, while the NU data is equivalent to the phase lead of the input data from the reference data.

The third inverter 165 complements the result of comparison from the first JK-flip-flop 163 to output the complemented data to the third logic circuit 167. The fourth inverter 164 complements the result of comparison from the second JK-flip-flop 162 to output the complemented data to the fourth logic circuit 166.

The third logic circuit 167 and the fourth logic circuit 166 are both circuits adapted for performing input negative logic AND operation.

The third logic circuit 167 outputs "1" or "0" to a tri-state buffer 169 if the NU data is "1" and the ND data is "0" or if otherwise, respectively. This "1" or "0" output represents an on/off control signal for the tri-state buffer 169.

The fourth logic circuit 166 outputs "1" or "0" to a tri-state buffer 168 if the NU data is "0" and the ND data is "1" or if otherwise, respectively. This "1" or "0" output represents an on/off control signal for the tri-state buffer 168.

If the output of the third logic circuit 167 is "1" or "0", the tri-state buffer 169 outputs to a tri-state output (TRI-D) terminal 173 a level corresponding to a pre-set voltage, for example, a ground voltage (GND), or transfers to a floating state, respectively.

If the output of the fourth logic circuit 166 is "1" or "0", the tri-state buffer 168 outputs to a tri-state output (TRI-U) terminal 171 a level corresponding to a pre-set voltage, for example, a ground voltage (GND), or transfers to a floating state, respectively.

In the phase comparator shown in FIG. 4, the first detector 154, second detector 155, first/second JK-flip-flops 163, 162 are responsive to pre-set operating clocks to perform a data outputting operation. Therefore, the phase deviation between the NU data and the ND data, produced due to the differential delay of the input data ascribable to the looped or feedback portion, or the phase deviation between the two tri-state logic outputs, is not produced.

The first/second detectors 154, 155 are hereinafter explained.

In the first/second detectors 154, 155, the reference/input data, sent from the REF/VER input terminal 181, is sent to a D terminal of the D-flip-flop 184, as shown in FIG. 5.

The operating clocks sent from the CK input terminal 182 are sent to an inverter 183, a D-flip-flop 185 and to a D-flip-flop 186. The operating clocks are also complemented by an inverter 183 before being sent to the D-flip-flop 184.

The D-flip-flop 184 is responsive to the inputting of the complemented operating clocks from the inverter 183 to send the above reference/input data to the D-flip-flop 185.

The D-flip-flop 185 is responsive to the inputting of the operating clocks to send the output of the D-flip-flop 184, that is the above reference/input data, to the D-flip-flop 186 and to the fourth logic circuit 187.

The D-flip-flop 186 is responsive to the inputting of the operating clocks to send the output of the D-flip-flop 185, that is the above reference/input data, to the D-flip-flop 186 and to the fourth logic circuit 187.

The fourth logic circuit 187 outputs "1" to an edge data (P-EDG) output terminal 188 only when the output of the D-flip-flop 185 is "1" and the output of the D-flip-flop 186 is "0". The output data in this case is the above-mentioned first/second edge data.

In the first/second detectors 154, 155, configured as shown in FIG. 5, outputting of the D-flip-flops occurs responsive to pre-set operating clocks. Thus, the two input data to the fourth logic circuit 187 are outputted in synchronism with the above operating clocks.

Figure 6:
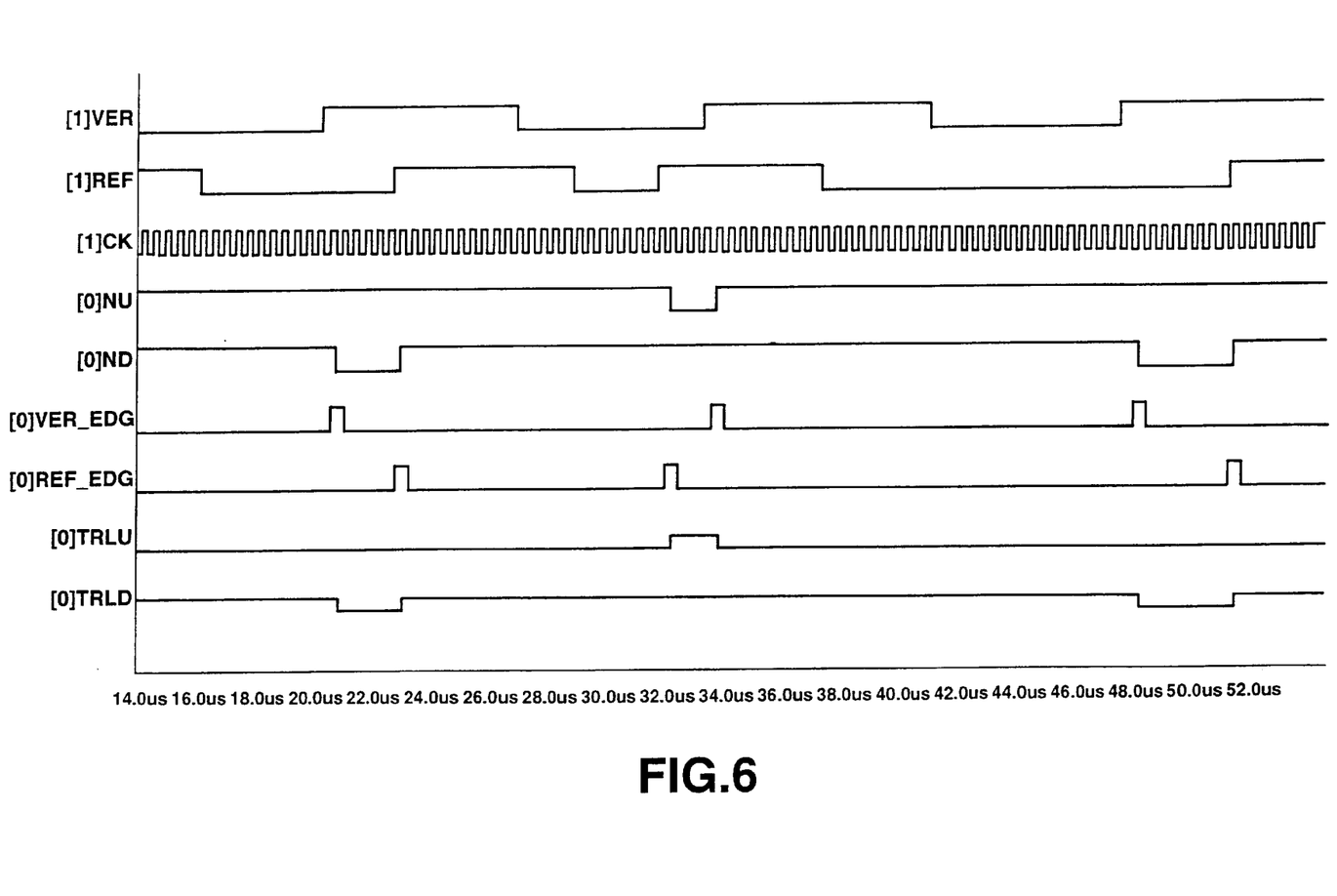
FIG. 6 shows a timing chart of input and output data to or from the phase comparator shown in FIG. 4.

FIG. 6 shows a timing chart of respective outputs of the phase comparator 150.

In this figure, VER, REF, CK, NU, ND, VER-EDG, REF-EDG, TRI-U and TRI-D represent the input data, reference data, operating clocks, NU-data, ND-data, second edge data from the second edge (VER-EDG) output terminal 157, first edge data from the first edge (REF-EDG) output terminal 156, tri-state logic output from the tri-state output (TRI-U) terminal 171 and a tri-state logic output from the tri-state output (TRI-D) terminal 173, respectively.

The phase comparator outputs the second edge data (VER-EDG) with a lag of a one-half period of the operating clocks as from the rising of the input data (VER), while outputting the first edge data (VER-EDG) with a lag of a one-half period of the operating clocks as from the rising of the reference data (REF), as shown in FIG. 6.

Also, NU data "0" or "1" is outputted only when the first edge data (REF-EDG) is outputted earlier than the second edge data (VER-EDG), that is when the reference data (REF) has a phase lead relative to the input data (VER), or when otherwise, respectively. Moreover, the level corresponding to the voltage Vcc is outputted as the tri-state logic output (TRI-U) only when the "0" NU data is outputted.

Similarly, NU data "0" or "1" is outputted only when the second edge data (VER-EDG) is outputted earlier than the first edge data (REF-EDG), that is when the reference data (REF) has a phase lag relative to the input data (VER), or when otherwise, respectively. Moreover, the level corresponding to the ground potential is outputted as the tri-state logic output (TRI-D) only when the "0" ND data is outputted.

Since the flip-flops in the first/second detectors 154, 155 are responsive to the pre-set operating clocks to output data, the edge data outputted by the detectors are in phase with one another at the outputting time.

Moreover, since the outputting operation of the first/second JK-flip-flops 163, 162 are similarly controlled responsive to the pre-set operating clocks, there is produced no phase deviation between the results of comparison, that is between the NU and ND data, outputted by the JK-flip-flops.

This enables suppression of the malfunction otherwise caused by phase deviation at the outputting time of the results of comparison in the VCO voltage control operation employing the above results of comparison.

As an illustrative example of the phase-locked loop circuit according to the present invention, a motion picture film reproducing apparatus, in which the teaching of the present invention is applied to a playback clock producing portion employed during the reproducing operation of the digitally recorded speech output at the time of reproduction of the motion picture film, is explained.

The motion picture film reproducing apparatus is configured for performing a so-called changeover operation of storing a sole motion picture in plural film rolls and reproduction is transferred from a first film roll to the second film roll. The phase-locked loop circuit according to the present invention is applied to an apparatus portion configured for generating correct system clocks, that is playback clocks, for the reproducing apparatus itself, at the time of the above changeover operation.

Figure 7:
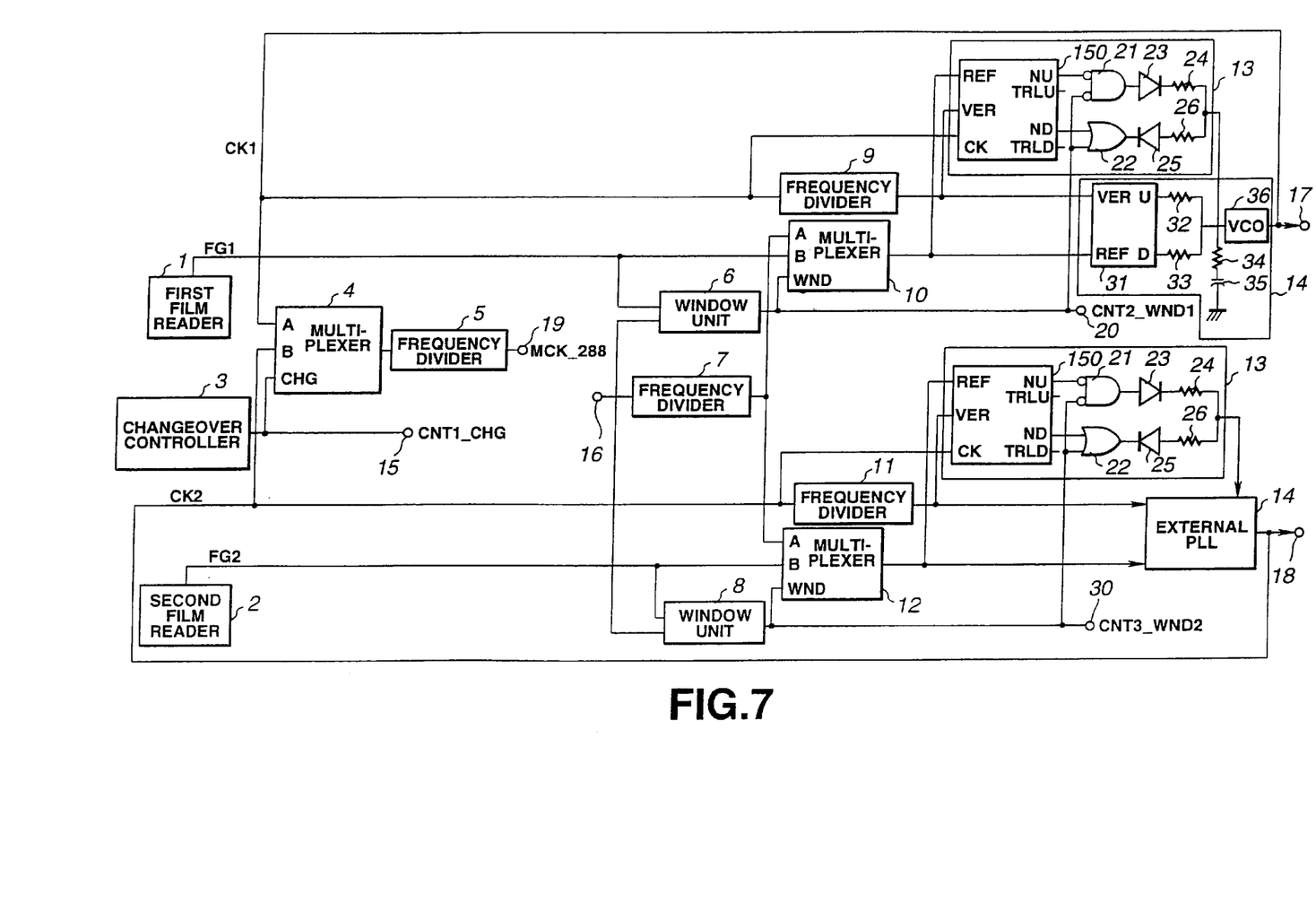
FIG. 7 is a block circuit diagram showing an example of application of the phase-locked loop circuit according to the present invention.

Referring to FIG. 7, the configuration shown in FIG. 4 is applied to a phase comparator 150 in a speed-up PLL circuit 13 adapted for speed-up of the operation of an external PLL circuit 14 configured for generating the playback clocks for effecting outputting designed for lowering the time constant of the external phase-locked loop circuit 14.

The motion picture film is formed with perforations for extending on both sides of an image recording area at pre-set intervals along the film proceeding direction. Between the perforations and the associated film edges are formed digital sound tracks for the right channel and those for the left channel for extending along the proceeding direction of the motion picture film. The frame signals FG1, FG2 for the repetition frequency of the perforations are of a frequency of 96 Hz.

If, in FIG. 7, a sole motion picture film is recorded in two film rolls, namely a first film roll and a second film roll, the first film roll, having recorded therein the former half portion of the motion picture, is set on a first film leader 1, whilst the second film roll, having recorded therein the latter half of the motion picture, is set on a second film roll 2. At first, only the first film reader 1 becomes operative, by the control operation by a changeover controller 3, by way of reproducing the motion picture film.

The first film reader 1 detects the perforations from the first film roll, while outputting the frame signal FG1.

The frame signal FG1 is sent to a window portion 6 and to a B terminal of a multiplexer 10.

The second film reader 1 similarly detects the perforations from the second film roll, while outputting the frame signal FG2. The frame signal FG2 is sent to a window portion 8 and to a B terminal of a multiplexer 12.

The changeover controller 3 is configured for outputting data of two level data "L" or "H" for selecting the first/second film rolls, and sends the "L" level or the "H" level to a changeover terminal (CHG) of the multiplexer 4 and, to a control terminal 15(CNTI_CHG) if the playback clocks are to be formed using the frame signal FG1 obtained from the first film roll or if the playback clocks are to be formed using the frame signal FG2 obtained from the second film roll, respectively.

The multiplexer 4 selects the playback clocks CK1 sent to a terminal A or the playback clocks CK2 sent to a terminal B responsive to the "L" or "H" data entered to the changeover terminal CHG to send the selected data to a frequency dividing circuit 5. The playback clocks CK1, CK2 are each of a frequency of, for example, 1.764 MHz.

If the "L" or "H" level is entered to the changeover terminal CHG, the terminal A or B is selected, respectively.

The playback clocks CK1 are clock data produced by a VCO 36 which will be explained subsequently. Similarly, playback clocks CK2 are clock data produced by a VCO of an external PLL circuit 14 which will be explained subsequently.

The frequency dividing circuit 5 divides the frequency of the playback clocks CK1 or CK2, selected by the multiplexer 4 and entering the circuit 5, to 1/6125, that is to 1.764 MHz/6125=288 Hz, to output the resulting master clock data to a master clock output terminal 19 (MCK_288).

The reference clock (X), with a frequency of, for example, 192 Hz, sent from the reference input terminal 16, are sent to the window portions 6 and 8 and to the frequency dividing circuit 7.

The frequency dividing circuit 7 halves the reference clocks and sends the data with 192×½=96 Hz to the terminal A of the multiplexer 10 and to the terminal A of the multiplexer 12.

The windowing portion 6 windows the frame signal FG1 using the reference clock signals of 192 Hz, and sends the windowed "L" or "H" level data (WND) to a changeover terminal (WND) of the multiplexer 10, a NOR gate 21 of the speed-up PLL circuit 13 and to a windowed data output terminal 20(CNT2_WND).

The windowing unit 8 is designed for windowing the frame signal FG2 using the above reference clocks and sends the windowed "L" or "H" level data (WND) to a changeover terminal (WND) of the multiplexer 12, a NOR gate 21 of the speed-up PLL circuit 13 and to a windowed data output terminal 30 (CNT3_WND).

The frequency dividing circuit 9 is designed to divide the frequency of the playback clocks CK1 by 18375. That is, the frequency dividing circuit 9 divides the 1.764 MHz playback clocks by 18375 to 96 Hz to send the frequency divided data to an input data terminal (VER) of the phase comparator 150 of the speedup PLL circuit 13 and to an input data terminal (VER) of the phase comparator 31 of the external PLL circuit 13.

The multiplexer 10 selects the 96 Hz data, obtained on the basis of the reference clocks sent to the terminal A, or the above frame signal FG1 sent to the terminal B, based on the windowed data sent to the changeover terminal (WND), and sends the selected data to a reference data terminal (REF) of the phase comparator 150 or to a reference data terminal (REF) of the phase comparator 31.

If the input windowed data is of the "L" or "H" level, the terminal A, that is data obtained on the basis of the reference clocks, or the terminal B, that is the above frame signal FG1, is selected, respectively.

The frequency dividing circuit 11 is designed to divide the frequency of the playback clocks CK2 by 18375. That is, the frequency dividing circuit 11 divides the 1.764 MHz playback clocks by 18375 to 96 Hz to send the frequency divided data to an input data terminal (VER) of the phase comparator 150 of the speedup PLL circuit 13 and to the phase comparator 31 of the external PLL circuit 14.

The multiplexer 12 selects the 96 Hz data, obtained on the basis of the reference clocks sent to the terminal A, or the above frame signal FG2 sent to the terminal B, based on the windowed data sent to the changeover terminal (WND), and sends the selected data to a reference data terminal (REF) of the phase comparator 150 and to the phase comparator 31 of the external PLL circuit 14.

The speedup PLL circuit 13 of the same structure is separately provided for processing the frame signal FG1 and the frame signal FG2, and includes the above-mentioned phase comparator 150.

In each speedup PLL circuit 13, an output of the multiplexer 10 is sent to a reference data terminal REF of the phase comparator 150, whilst an output of the frequency dividing circuit 9 is sent to an input data terminal VER and the above-mentioned playback clocks CK1 are sent to a clock terminal CK.

The phase comparator 150 phase-compares the reference data and the input data based on the playback clocks. The resulting NU data are sent to the NOR circuit 21, whilst ND data are sent to an OR gate 22.

The logic circuit 21 outputs "1" or "0" to a diode 25 if the NU data and the windowed data are both "0" or if otherwise, respectively.

The OR gate 22 outputs "0" or "1" to a diode 25 if the NU data and the windowed data are both "0" or if otherwise, respectively.

The diode 23 allows only the positive side of the output of the NOR gate 21 to pass therethrough and to be outputted as a driving voltage to a VCO 36 of the external PLL circuit 14 via resistor 24 and a low-pass filter made up of a resistor 34 in the external PLL circuit 14 as later explained and an electrolytic capacitor 35, as will be explained subsequently.

The diode 25 allows only the negative side of the output of the OR gate 22 to pass therethrough and to be outputted as a driving voltage to the VCO 36 via resistor 26 and a low-pass filter made up of the resistor 34 and the electrolytic capacitor 35 as will be explained subsequently.

Each one external PLL circuit 14 of the same structure is provided for processing the frame signal FG1 and the frame signal FG2. Each external PLL circuit 14 includes a phase comparator 31, resistors 32/33, a low-pass filter made up of the resistor 34 and the electrolytic capacitor 35 and a VCO 36. The external PLL circuit 14 processing the frame signal FG1 generates the playback clocks CK1, while that processing the frame signal FG2 generates the playback clocks CK2.

In the external PLL circuit 14, the phase comparator 31 is configured similarly to the usual phase comparator and operates for comparing the phase of the reference data to that of the input data to output U data and D data as the results of comparison. The U data and the D data specify the phase lead and the phase lag the input data phase has with respect to the reference data, respectively.

This phase comparator 31 may be configured similarly to the above phase comparator 150.

The above low-pass filter operates to cut high frequency components of the U and D data to permit only the low-frequency components to pass therethrough. These low-frequency components are sent to the above-mentioned VCO 36.

The VCO 36 generates oscillation on the bass of the low-range components of data sent from the speedup PLL circuit 13 or the low-range components of the U and D data from the phase comparator 31. The oscillation output of the VCO is sent on the FG1 processing side and on the FG2 processing side to an output terminal 17 and to an output terminal 18, respectively, so as to be used for producing playback clocks used for reproducing the motion picture film, for example, the playback frequency of 44.1 kHz for the playback sound.

This oscillation output on the FG1 processing side is sent as the above-mentioned playback clocks CK1 to the multiplexer 4, frequency dividing circuits 9/11 and to the speedup PLL circuit 13 so as to be used as feedback outputs for the respective portions. Similarly, the oscillation output on the FG2 processing side is sent as the above-mentioned playback clocks CK2 to the multiplexer 4, frequency dividing circuits 9/11 and to the speedup PLL circuit 13 so as to be used as the feedback output for the respective portions.

By applying the structure shown in FIG. 4 to the phase comparator 150 in the speedup PLL circuit 13, as in the motion picture film reproducing device shown in FIG. 7, there is produced no phase lag between outputs of the speedup PLL circuits 13, that is the NU and ND data outputted by the phase comparator 150, as described above, thus enabling suppression of malfunctions otherwise produced in the VCO voltage control operation employing the NU and ND data due to phase deviation generated at the time of outputting of the results of comparison.

Moreover, the operation of the speedup PLL circuit is stabilized only after lapse of some time because of the long time constant of the PLL circuit 14. Thus, an output of the speedup PLL circuit 13 with a shorter time constant is used until stabilization of the VCO 36 for generating playback clocks.

In this manner, the output of the VCO 36 during the operation-on time is stabilized in a shorter time.

With the phase-locked loop circuit according to the present invention, as described above, the two input signals, that is the reference and input signals, are phase-compared in synchronism with the pre-set operating clocks, so that the comparison data resulting from the phase comparison may be outputted with a pre-set period, thereby assuring a simplified structure and reducing the malfunctions of the entire circuit.

What is claimed is:

1. A phase-locked loop circuit for locking the phase of an input signal to the phase of an input reference signal, comprising:

a phase comparator for comparing the phase of the input reference signal to the phase of the input signal wherein the input reference signal and the input signal are clocked by an independent pre-set clock signal, said phase comparator including first detection means for detecting a rising portion of reference data from the input reference signal and second detection means for detecting a rising portion of input data from the input signal wherein each of said first and second detection means include a first logic circuit for storing and outputting said reference and input data, respectively, responsive to the inputting of the clock signal, a second logic circuit for storing and outputting output data of said first logic circuit responsive to the inputting of the clock signal, a third logic circuit for storing and outputting output data of said second logic circuit responsive to the inputting of the clock signal and a fourth logic circuit outputting a positive state output if the state of output data of the second logical circuit and the state of a complemented version of output data of said third logic circuit are both positive.

2. A method for locking the phase of an input signal to the phase of an input reference signal, comprising the steps of:

comparing the phase of the input reference signal to the phase of the input signal, wherein the input reference signal and the input signal are clocked by an independent pre-set clock signal, by detecting a rising portion of reference data from the input reference signal and detecting a rising portion of input data from the input signal, wherein each detecting step stores and outputs said reference and input data, respectively, in response to the inputting of the clock signal, to provide a first output, stores and outputs the first output in response to the inputting of the clock signal, to provide a second output, stores and outputs the second output in response to the inputting of the clock signal, to provide a third output, and outputs a positive state if the state of the second output and the state of a complemented version of the third output are both positive.

* * * * *